(12) United States Patent
Ambrose et al.

(10) Patent No.: US 6,876,522 B2
(45) Date of Patent: Apr. 5, 2005

(54) GMR SPIN VALVE STRUCTURE USING HEUSLER ALLOY

(75) Inventors: Thomas F. Ambrose, Mars, PA (US); Oleg N. Mryasov, Bradford Woods, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 203 days.

(21) Appl. No.: 10/214,606

(22) Filed: Aug. 8, 2002

(65) Prior Publication Data

US 2003/0197986 A1 Oct. 23, 2003

Related U.S. Application Data

(60) Provisional application No. 60/373,469, filed on Apr. 18, 2002.

(51) Int. Cl.[7] .............................................. G11B 5/127
(52) U.S. Cl. ................................................ 360/324.11
(58) Field of Search ...................... 360/324.11, 324.12, 360/324; 324/252

(56) References Cited

U.S. PATENT DOCUMENTS

| | | | |
|---|---|---|---|
| 4,645,722 A | 2/1987 | Katayama et al. | 428/694 |
| 4,876,144 A | 10/1989 | Susa et al. | 428/336 |
| 5,190,599 A | 3/1993 | Sahashi et al. | 148/315 |
| 5,412,627 A | 5/1995 | Ichihara et al. | 369/13 |
| 5,492,773 A | 2/1996 | Sekiya et al. | 428/694 |
| 5,633,746 A | 5/1997 | Sekiya et al. | 359/280 |
| 5,652,445 A | 7/1997 | Johnson | 257/295 |
| 5,654,566 A | 8/1997 | Johnson | 257/295 |
| 5,793,279 A * | 8/1998 | Nepela | 338/32 R |
| 5,835,314 A | 11/1998 | Moodera et al. | |
| 6,029,895 A | 2/2000 | Ito et al. | 235/493 |
| 6,114,056 A | 9/2000 | Inomata et al. | 428/692 |
| 6,205,008 B1 | 3/2001 | Gijs et al. | 360/324 |
| 6,353,318 B1 | 3/2002 | Sin et al. | 324/252 |
| 6,365,286 B1 | 4/2002 | Inomata et al. | 428/692 |

FOREIGN PATENT DOCUMENTS

EP        0 827 220 A2    3/1998

OTHER PUBLICATIONS

"Observation of Giant Magnetoresistance in a Heusler Alloy Spin Valve", by P. Johnson, *IEEE*, 1996, pp. 4615–4617.

* cited by examiner

*Primary Examiner*—Allen Cao
(74) *Attorney, Agent, or Firm*—Westman, Champlin & Kelly, P.A.

(57) ABSTRACT

A giant magnetoresistive spin valve sensor is provided in which first and second ferromagnetic layers comprise a Heusler alloy. A non-ferromagnetic spacer layer is positioned between the first and second ferromagnetic layers. The non-magnetic spacer layer has an energy band which is similar to the energy bands of the Heusler alloy of the first and second ferromagnetic layers to allow a giant magnetoresistive effect to occur.

18 Claims, 6 Drawing Sheets

GMR SPIN VALVE STRUCTURE USING HEUSLER ALLOY

CROSS-REFERENCE TO RELATED APPLICATION

This application claims priority from U.S. Provisional Application No. 60/373,469 filed on Apr. 18, 2002 for inventors Thomas F. Ambrose and Oleg N. Mryasov and entitled All-Heusler Alloy CPP-GMR Spin Valve Structure.

FIELD OF THE INVENTION

The present invention relates to magnetic sensors. More particularly, the present invention relates to giant magnetoresistive (GMR) spin valve magnetoresistive sensors.

BACKGROUND OF THE INVENTION

Magnetic sensors utilizing the GMR effect, frequently referred to as "spin valve" sensors, are known in the art. A spin valve sensor is typically a sandwiched structure consisting of two ferromagnetic layers separated by a thin non-ferromagnetic layer. One of the ferromagnetic layers is called the "pinned layer" because it is magnetically pinned or oriented in a fixed and unchanging direction by an adjacent anti-ferromagnetic layer, commonly referred to as the "pinning layer," through anti-ferromagnetic exchange coupling. The other ferromagnetic layer is called the "free" or "unpinned" layer because the magnetization is allowed to rotate in response to the presence of external magnetic fields.

In a giant magnetoresistive sensor, a sense current is applied to the sensor and travels in the plane of the layers. In the presence of a magnetic field such as that provided by magnetic storage medium, the resistance of the sensor changes resulting in a change in voltage across the sensor due to the applied sense current. This voltage change may be measured and used to read back information. The operation of one configuration of a GMR sensor is described in U.S. Pat. No. 4,949,036, issued Aug. 14, 1990 to Grunberg, entitled "MAGNETIC FIELD SENSOR WITH FERRO-MAGNETIC THIN LAYERS HAVING MAGNETICALLY ANTIPARALLEL POLARIZED COMPONENTS".

The increase in a real density of magnetic recording disks to values larger than 100 Gbit/in$^2$ requires the development of new types of thin film read heads having a higher sensitivity than present spin valves. Currently spin valves are the most commonly used sensing device because they have a larger magnetoresistance (MR~15–20%) as compared to conventional anisotropic magnetoresistance (AMR~2%) devices. Furthermore, spin valves possess an intrinsic linear response allowing for a larger portion of the MR curve to be utilized while generating smaller harmonics in the output signal.

In recent years there has been a number of improvements to spin valve devices centered on the MR response. These developments include device size reduction, the addition of biasing layers, dual spin valve structures and tunnel junctions. Much of the research has focused on optimization of the MR properties as well. Specifically MR enhancement has resulted from varying layer thicknesses, "dusting" interfaces to improve the MR amplitude as well as structural stability upon annealing, and the addition of insulating layers to increase the specular reflection of the conduction electrons on outer surfaces of the layers. In all these cases, improvement of the MR response has come without fundamental changes in the device architecture and the materials set.

One material for use in giant magnetoresistive sensors that appears promising comprises Heusler alloy materials. However, attempts to implement giant magnetoresistive spin valve sensors using Heusler alloys have not met a great deal of success. The present invention provides a solution to this and other problems, and offers advantages over the prior art.

SUMMARY OF THE INVENTION

The present invention relates to giant magnetoresistive (GMR) spin valve sensors having ferromagnetic layers of a Heusler alloy and a non-ferromagnetic spacer layer which solve the above-mentioned problem.

In accordance with one embodiment of the invention, a giant magnetoresistive spin valve sensor is provided, along with a method for making such a sensor, in which a non-ferromagnetic spacer layer is provided between first and second ferromagnetic layers of a Heusler alloy. The non-ferromagnetic spacer layer has an energy band which is similar to energy bands of the Heusler alloys in the first and second ferromagnetic layers to allow for a giant magnetoresistive effect to occur.

These and various other features as well as advantages that characterize the present invention will be apparent upon reading of the following detailed description and review of the associated drawings.

DETAILED DESCRIPTION OF ILLUSTRATIVE EMBODIMENTS

The present invention relates to magnetoresistive sensors of the giant magnetoresistive (GMR or spin valve) type which are used to read back information from storage media such as magnetic discs. One aspect of the present invention includes a GMR sensor having ferromagnetic layers of Heusler alloy can be achieved by at least partially matching the energy bands of a non-ferromagnetic spacer to the energy bands for one of the spin states (majority or minority) of the ferromagnetic layers.

Figure 1A:
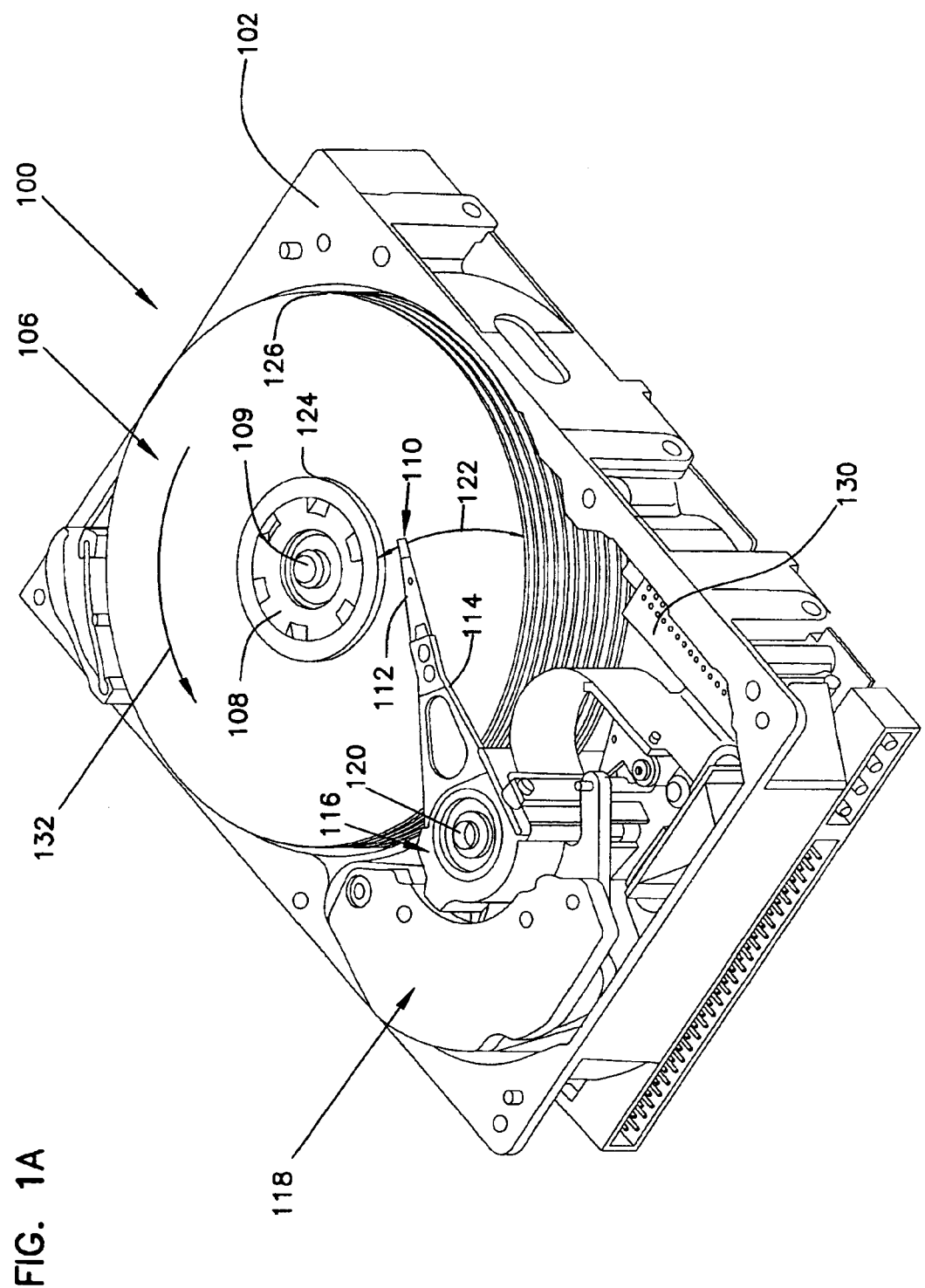
FIG. 1A is a perspective view of a disc storage system.

FIG. 1A is an isometric view of a disc drive 100 in which embodiments of the present invention are useful. Disc drive 100 includes a housing with a base 102 and a top cover (not shown). Disc drive 100 further includes a disc 106, which is mounted on a spindle motor (not shown) by a disc clamp 108. Disc 106 is part of a disc pack which includes a plurality of individual discs (storage media), which are mounted for co-rotation about central axis 109. Disc 106 has an associated disc head slider 110 which is mounted to disc drive 100 for communication with the disc surface. In the example shown in FIG. 1A, slider 110 is supported by suspension 112 which is in turn attached to a track accessing arm 114 of an actuator 116. The actuator shown in FIG. 1A is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along an arcuate path 122 between a disc inner diameter 124 and a disc outer diameter 126. Voice coil motor 118 is driven by servo electronics 130 based on signals generated by heads 110 and a host computer (not shown). Head assembly 110 includes a "slider" which carries a magnetic head (not shown in FIG. 1A) for perpendicular recording onto a surface of a disc.

Figure 1B:
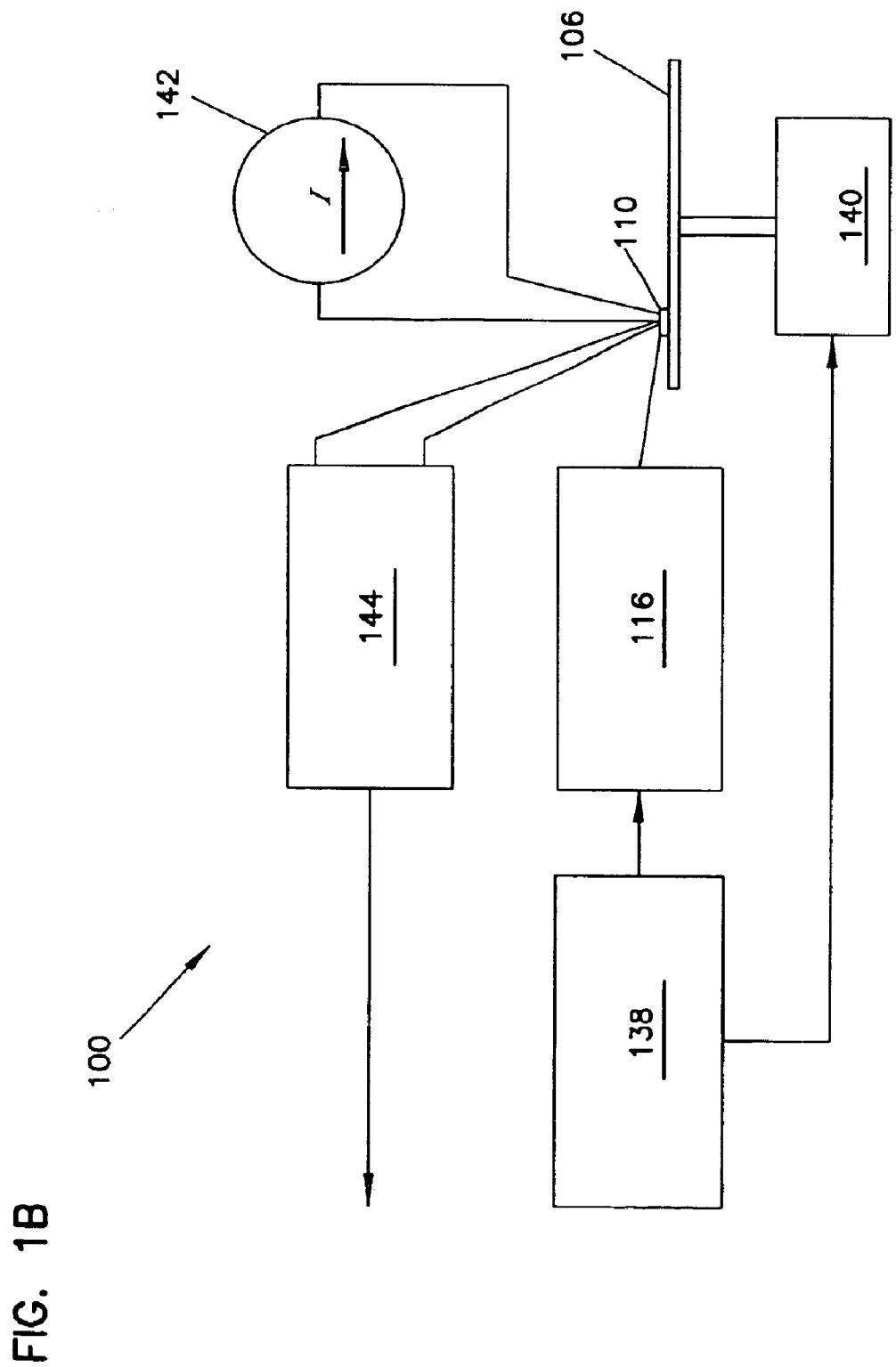
FIG. 1B is a simplified diagram of a storage system in accordance with the present invention.

The present invention includes a new spin valve sensor which may be used in a data storage system such as data storage system 100 shown FIG. 1A. FIG. 1B is a simplified block diagram showing system 100, storage medium 108 which is rotated by motor 140. A controller 138 controls positioning of the slider 110. A magnetoresistive sensor on slider 110 operates by receiving a sense (or bias) current I from current source 142. Variations in a magnetic field applied to the magnetoresistive sensor due to magnetization of disc 106 cause a change in the electrical resistance of the sensor. This change in electrical resistance is detected with read-back circuitry 144 which responsively provides data output.

Field sensing devices such as the sensor carried on slider 110 are based upon a phenomenon known as giant magnetoresistance (GMR). GMR is a quantum mechanical effect observed in thin film magnetic multilayer structures that are composed of alternating ferromagnetic and nonmagnetic layers. Due to the relative alignment of the magnetization in adjacent ferromagnetic layers the spin dependent scattering of the conduction electrons is minimized when the magnetization of the ferromagnetic layers are parallel and the multilayer will have a low resistance. When the magnetization of the ferromagnetic layers are anti-aligned, the spin dependent scattering of the conduction electrons is maximized and the multilayer has a high resistance. The directions of the magnetization are easily manipulated by an external magnetic field that is applied to the material. Thus the resistance of this type of multilayer will vary with magnetic field and is extremely useful for sensing applications. A simple form of this multilayer structure is the spin valve.

In a thin film multilayer GMR system, the magnetoresistance needs to be measured. There are two sensing geometries that are commonly used for such structures. The first known as current in plane (CIP) where the electrical current is parallel to the plane of the film and is the simplest method to measure resistance of a GMR multilayer sheet film, requiring no lithographic preparation. The second geometry is known as current perpendicular to the plane (CPP) where the electrical current is sent perpendicular to the film plane. In this geometry a pillar structure used to increase the resistance of the layers to a suitable value for measurement. The trajectory of the conduction electrons in the CIP measurement is much more complex than CPP and modeling of such geometry can be difficult. The GMR value is higher in CPP geometry, however, a tradeoff of the sample preparation needs to be included.

This description of the GMR effect in magnetic multilayers is rather simplistic and requires a more detailed explanation of spin polarized transport. Spin polarized transport occurs naturally in any material in which there is an imbalance of the spin populations at the Fermi energy level. A magneto-resistive response commonly occurs in ferromagnetic metals because the density of states available to spin up and spin down electrons at the Fermi level are different and also these states have a different mobility. This asymmetry of the conduction electrons majority and minority spin states can be characterized with P, the spin polarization parameter defined in the following manner:

$$P = [N\uparrow(E_F) - N\downarrow(E_F)]/[N\uparrow(E_F) + N\downarrow(E_F)] \quad (1)$$

where $N\uparrow(E_F)$ and $N\downarrow(E_F)$ are the number of electrons in the spin up and spin down bands at the Fermi energy respectively.

From Eq. 1, the spin polarization can have a value ranging from zero to one. A nonmagnetic material such as copper has a spin polarization of zero while ferromagnetic materials have a non-zero spin polarization value. For the transition metal ferromagnets such as Fe, Co and Ni, the net spin polarization values have been measured to be around 0.40. A special case occurs when the spin polarization is exactly equal to one. In this circumstance the material is labeled as a "half-metallic ferromagnetic" since electrons will populate only one spin band and be 100% spin polarized. Therefore in this unique material, one spin band will have a metallic character while the other spin band will have semiconducting character. This feature is significant for transport effects such as GMR because the spin dependent scattering of the polarized conduction electrons is maximized. A device fabricated out of half-metallic ferromagnetic materials is therefore highly desirable.

One such set of half-metallic ferromagnetic materials is the Heusler alloys. The Heusler alloys are ferromagnetic ternary alloys that contain manganese where the ferromagnetism is critically dependent upon both the magnetic and chemical ordering of the Mn atom. Many Heusler alloys possess very high Curie temperatures (700° C.) along with larger magnetic moments (3.5 $\mu_B$/formula unit). The high degrees of spin polarization make Heusler alloys good candidates for incorporation into field sensing devices. While there are many varieties of Heusler alloys, only a limited number have been predicted to be half-metallic ferromagnets.

Figure 2A:
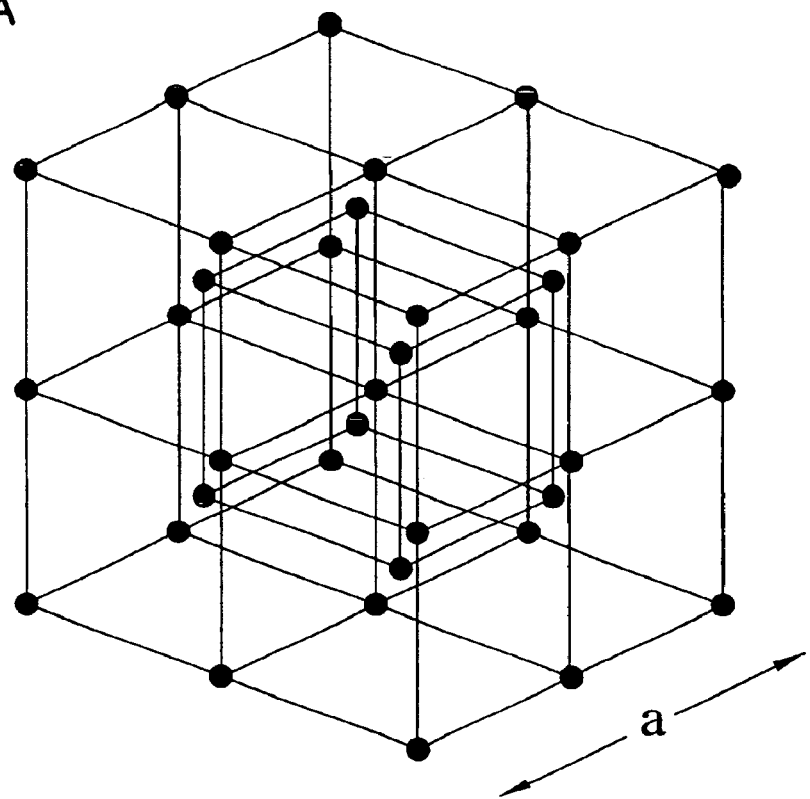
FIG. 2A shows the crystal structure of a full Heusler alloy $A_2MnB$.
Figure 2B:
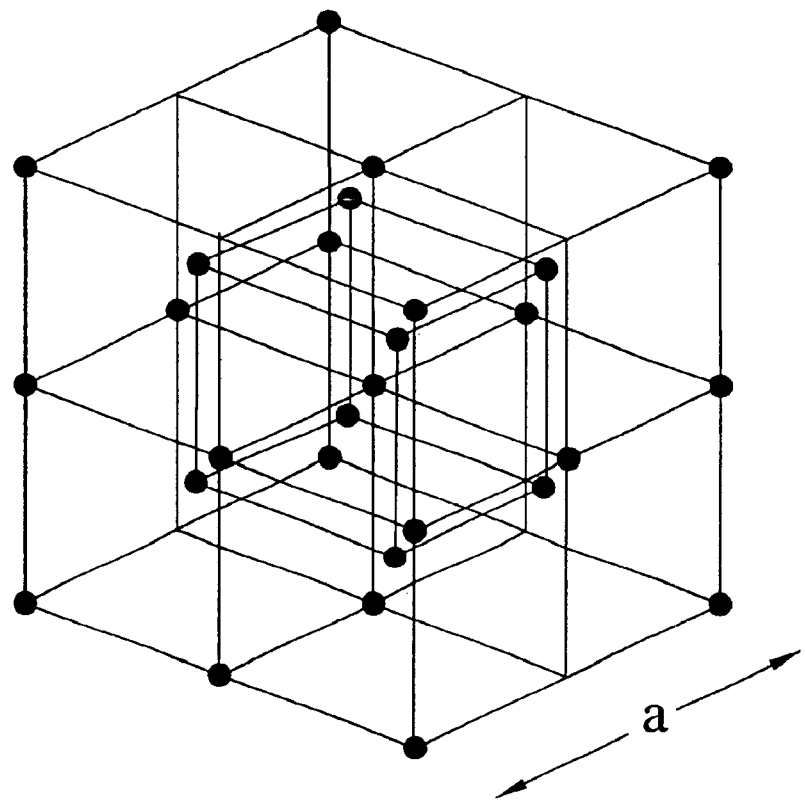
FIG. 2B shows the crystal structure of a half-Heusler alloy AMnB.

A Heusler alloy has the chemical formula $A_xMnB$, where A and B are metals or semiconductors. The subscript X can be either 1 or 2 denoting either a full ($L2_1$ crystal structure) or a half ($C1_b$ crystal structure) Heusler alloy. FIG. 2A shows the unit cells for a full Heusler alloy $A_2MnB$ and FIG. 2B shows a half Heusler alloy AMnB. As illustrated in FIGS. 2A and 2B, the half Heusler alloy has empty sites in the unit cell that can easily contribute to atomic site disorder and vary both the electrical and magnetic properties of the material. It has also been shown that such disorder will reduce the spin polarization value of the material as well. The effects of disorder will likely be less in full Heusler structure as compared to the half Heusler counterparts. Therefore it is advantageous to fabricate a sensor using full Heusler alloy materials.

A discussion on the importance of the selection of an appropriate non-magnetic spacer layer is useful in understanding the invention. In a GMR multilayer sensor, the spacer layer plays an important role as a discriminator (spin polarizer) by distinguishing between both the spin up and spin down conduction electrons that cross the ferromagnetic/ non-magnetic interface. The non-magnetic spacer layer has the unique character of selectively matching its electronic energy bands with one of the spin-split bands in the ferromagnetic layer. This is important for momentum transfer of the spin-polarized conduction electrons across the interfaces. Without the selective transfer of electrons across the interface, no magneto-transport effect will be observed.

Figure 3A:
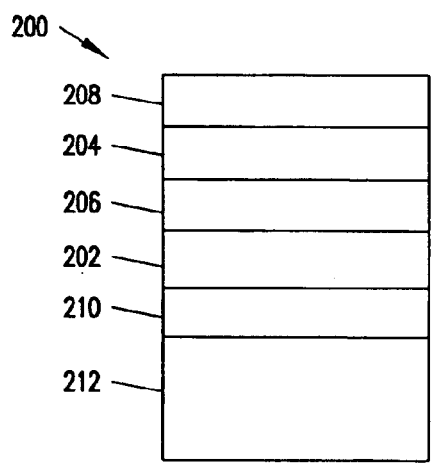
FIG. 3A is a cross-sectional view of a prior art giant magnetoresistive spin valve sensor.

To illustrate this aspect of spin valve operation, consider the simplified spin valve 200 shown in FIG. 3A. Spin valve 200 includes two ferromagnetic layers 202, 204 of face centered cubic (fcc) cobalt which sandwich a non-magnetic spacer layer 206 of fcc copper. An antiferromagnetic layer 208 such as PtMn is used to pin one of the cobalt layers 204. A buffer layer 210 separates layer 202 from a substrate 212. In zero magnetic field, an anti-parallel alignment of the two cobalt layer 202, 204 magnetization results and a high resistance state is measured. The change in resistance can be quantified as $\Delta R/R$. A typical prior art spin valve sensor may provide $\Delta R/R$ of 15%. The spin valve sensor of the present invention may exhibit an $\Delta R/R$ as high as 100%. By applying a magnetic field, the magnetization of both cobalt layers 202, 204 lie parallel to each other and a low resistance is measured. A large GMR response is observed in this multilayer system because the electronic structure of copper is similar to the electronic structure of the spin up bands of cobalt.

Figure 4:
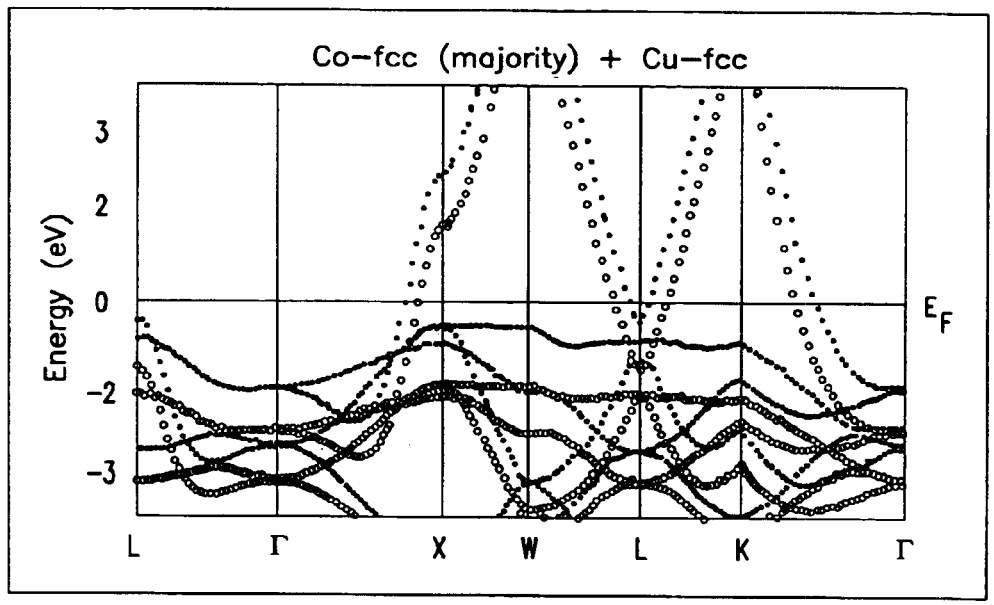
FIG. 4 is an energy band graph which shows the energy bands for cobalt (Co) and copper (Cu) having a face-centered cubic structure (fcc).

A comparison of the electronic structure of both materials is shown in FIG. 4 where the energy bands along the high symmetry lines in the Brillouin zone are shown. The Fermi energy is defined at 0 eV. From FIG. 4 around the Fermi energy, it is clear that the energy bands of the copper spin up states (circles) and the energy bands of cobalt (dots) have a similar electronic character. Specifically the energy bands lie close to each other and allow momentum transfer of the selected spin state (spin-up) at the ferromagnetic and non-magnetic interface. In contrast the minority (spin down) states get reflected at the interface due to the mismatch with Cu bands. This selective momentum transfer is essential to large magneto-transport effect observed in Co/Cu/Co based tri-layers (spin-valves). If no momentum transfer is present then the electrons will scatter at the interface and no GMR results. Therefore, the selection of an appropriate non-magnetic spacer layer is an integral part of the GMR effect.

With the present invention, a CPP spin valve structure is provided which includes ferromagnetic Heusler alloy and non-ferromagnetic Heusler-like materials. The full Heusler alloy $Co_2MnSi$ or $Co_2MnGe$ as the ferromagnetic layers are preferable due to their prediction of high spin polarization and possible half-metallic behavior from band structure calculations. Furthermore, the full Heusler alloy ferromagnet are preferred to the half Heusler alloy ferromagnet because of the reduced risk of atomic site disorder which minimizes the scattering effect on vacancies. However, any appropriate Heusler or Heusler-like alloys may be chosen accordingly to the outlined scheme if suitable from processing, resistivity and lattice spacing properties point of view.

From band structure calculations, both suggested Heusler alloy ferromagnets ($Co_2MnSi$ and $Co_2MnGe$) have none or a very small number of minority spin states at the Fermi Level at room temperature. Therefore, half-metallic behavior of these ferromagnets require transport of the spin up current to be maximized and the spin down current to be minimized. This limits the non-magnetic spacer material which can be used. Two non-magnetic spacer materials are $Rh_2CuSn$ and $Co_2CuSn$ which have a similar electronic band structure character, crystal structure, and layer resistivities to that of the ferromagnetic materials. Band-structure calculations predict that these materials provide good band matching between majority states of the selected FM Heusler alloys and spacer Heusler alloys. This ensures high spin asymmetry of the conduction electrons and correspondingly the highest MR response of the GMR spin valve.

Figure 3B:
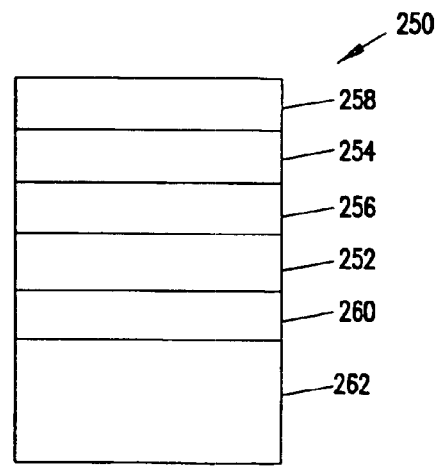
FIG. 3B is a cross-sectional view of a giant magnetoresistive spin valve sensor in accordance with the present invention.

FIG. 3B is a cross-sectional view of a spin valve sensor 250 in accordance with one example of the embodiment of the present invention. Sensor 250 includes Heusler alloy ferromagnetic layers 252 and 254. Layers 252 and 254 are separated by a non-magnetic spacer 256 which comprises a Heusler-like alloy. A pinning layer 258 is positioned over ferromagnetic layer 254. The structure is deposited on buffer layer 260 and substrate 262.

The proposed spin valve 250 structure of the invention combines the ferromagnetic Heusler alloys $Co_2MnGe$ or $Co_2MnSi$ and the nonmagnetic spacer Heusler alloys $Rh_2CuSn$ or $Co_2CuSn$. The ferromagnetic layers 252, 254 of this spin valve 250 are made of the full Heusler $Co_2MnSi$ or $Co_2MnGe$ alloys which, according to the band structure calculations, have a band gap in the minority spin down channel. These alloys both have a high Curie temperature ($T_c>700C.$) as well as the full Heusler alloy crystal structure ($L2_1$) that limits the atomic disorder. Calculations predict a 100% spin-polarized electron current that is much higher than that found in the conventional metallic GMR sensor materials (comprising, for example, Co, Fe, FeCo and FeNi). Spacer materials are preferably selected to provide good electronic band matching and small lattice mismatch with the ferromagnetic materials. For example, the lattice parameters should be within 5%, and preferably within 3%, of each other. The band matching allows for high asymmetry in majority and minority spins states and selective scattering of electrons at the interfaces between the ferromagnetic and the non-magnetic spacer layers. This condition is important for the CPP GMR response. The condition of lattice matching allows minimization of spin-dependent scattering at the interface that may arise from the large lattice mismatch creating a significant amount of defects.

Figure 7:
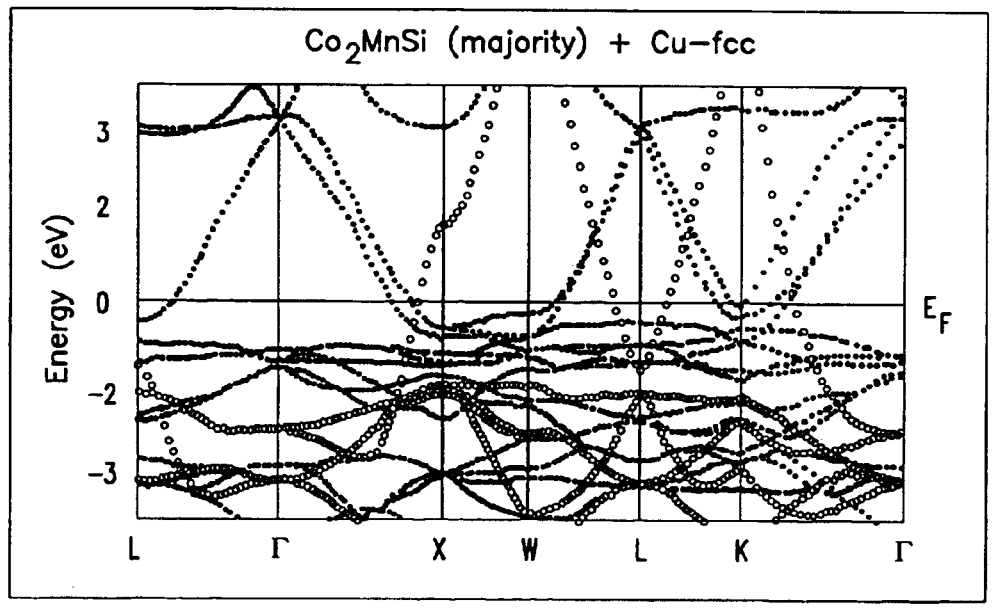
FIG. 7 is an energy band graph which shows the energy bands for the $L2_1 Co_2MnSi$ Heusler alloy and fcc Cu.
Figure 5:
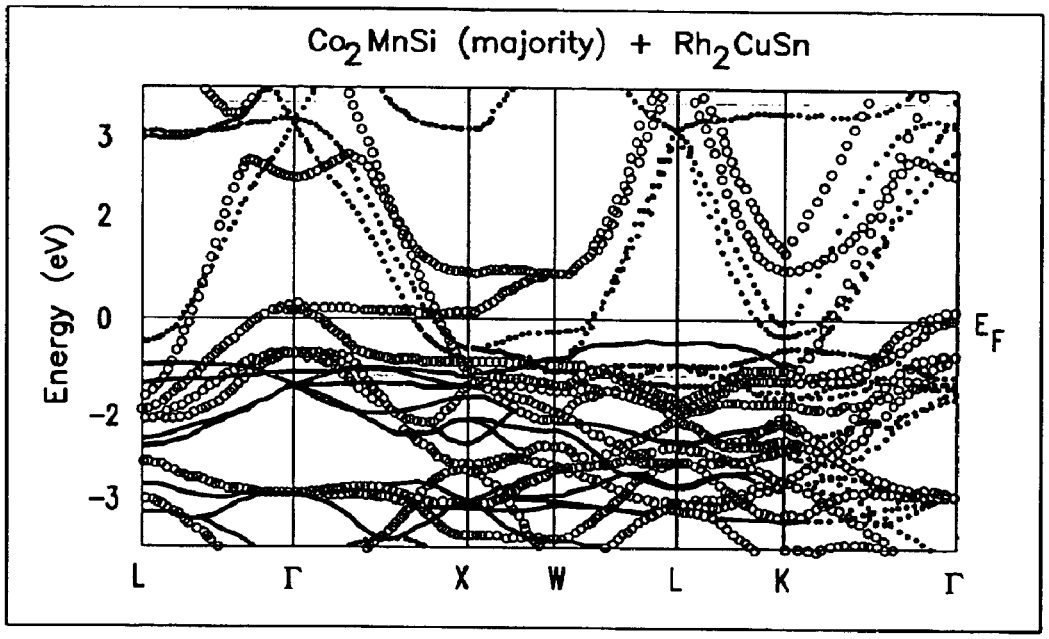
FIG. 5 is an energy band graph which shows the energy bands for $Co_2MnSi$ and $Rh_2CuSn$ Heusler alloys.
Figure 6:
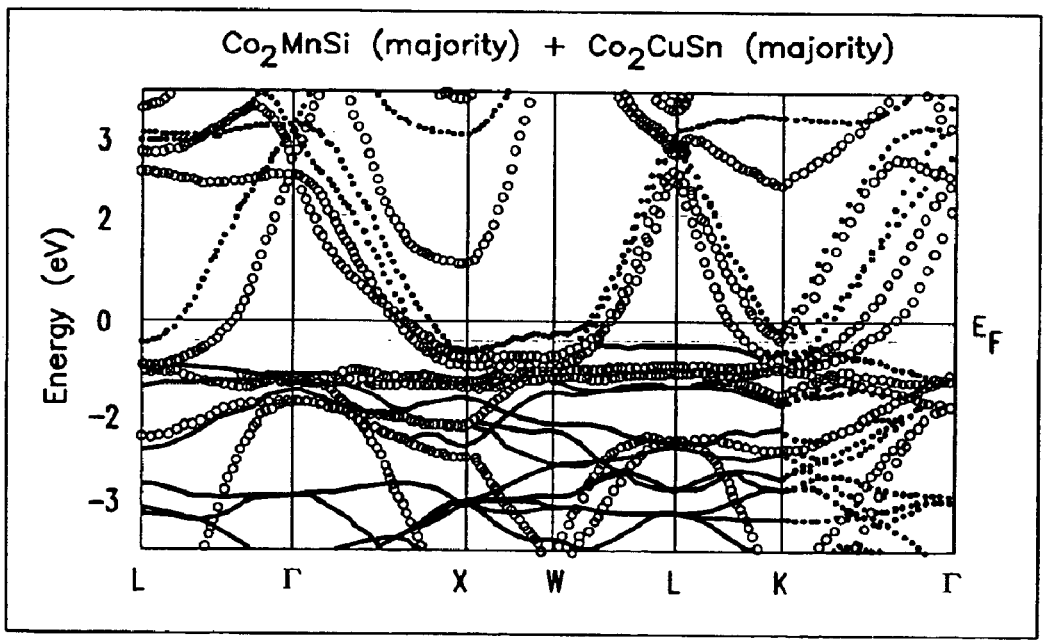
FIG. 6 is an energy band graph which shows the energy bands for $Co_2MnSi$ and $Co_2CuSn$ Heusler alloys.

The band structure calculations were done using a full-potential linear muffin-tin orbital methodology that allows an accurate description of the electronic band-structure within the local spin density approximation. Two non-magnetic full Heusler alloys, $Rh_2CuSn$ and $Co_2CuSn$ are preferable spacer layers. These materials provide good band matching. (One technique to obtain a good band match is to seek materials which have a slope (moment). The same slope (moment) near the Fermi level.) The results of these calculations are shown in FIGS. 5 and 6. FIG. 5 shows the energy band graphs for $Co_2MnSi$ (dots) and $Rh_2CuSn$ (circles). FIG. 6 shows the energy band graphs for $Co_2MnSi$ (dots) and $Co_2CuSn$ (circles). These graphs illustrate energy bands which are similar. By contrast, the electronic structure of the majority band of $Co_2MnSi$ with fcc Cu are shown in FIG. 7. As shown in FIG. 7, the character of electronic energy bands for majority states of $Co_2MnSi$ and for fcc Cu are completely different. Hence, there will be significant reflection of the majority spin states at the interfaces between the ferromagnetic layers and the spacer layer and a corresponding reduction in the transfer of these states across the ferromagnetic/non-magnetic interface. This reduction diminishes the advantages of the use of these materials with high spin asymmetry of conduction electrons and is a reason for failure of previous attempts to utilize the NiMnSb half-Heusler alloy in a GMR sensor configuration. This example demonstrates the advantage of the use of an appropriate Heusler alloy spacer for utilizing the high spin polarization of the ferromagnetic layer. As can be seen in FIG. 7, the combination of the Heusler alloy ferromagnet with the non-magnetic fcc Cu, a material traditionally used in GMR stack, is very disadvantageous from the point of view of spin state selective scattering at the interfaces.

As used herein, nonmagnetic Heusler-like alloys include alloys which have the crystal structure of a Heusler alloy without the presence of Mn. Further, although the specific examples of spin valves set forth herein use ferromagnetic layers of $Co_2MnSi$ or $Co_2MnGe$, and nonmagnetic spacer layers of $Rh_2CuSn$ or $Co_2CuSn$, the present invention is not limited to these materials. Any ferromagnetic Heusler alloy having the desired magnetic properties can be used along with any spacer material which has a similar band structure and is of a Heusler-like alloy. The energy bands should be sufficiently similar to allow a giant magnetoresistive effect to occur in the presence of an applied magnetic field.

A giant magnetoresistive spin valve sensor 250 is provided which includes a pinning layer 258 and first and second ferromagnetic layers 252, 254 which extend in a plane adjacent the pinning layer. The first and second ferromagnetic layers 252, 254 are of Heusler alloys. A non-ferromagnetic spacer layer 256 is provided between the first and second ferromagnetic layers 252, 254 and has an energy band which is sufficiently similar to energy bands of the first and second Heusler alloys to allow a giant magnetoresistive effect to occur in the presence of a magnetic field.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the sensor while maintaining substantially the same functionality without departing from the scope and spirit of the present invention. In addition, although the preferred embodiment described herein is directed to a system for storing data, it will be appreciated by those skilled in the art that the teachings of the present invention can be applied to spin valve sensors used in any application, for example Magnetic Random Access Memory (MRAM) devices, without departing from the scope and spirit of the present invention. The invention can be used with other layer structures and/or compositions. The spin valve can function without a pinning layer, or with a ferromagnetic layer that is only weakly pinned.

What is claimed is:

1. A giant magnetoresistive spin valve sensor for sensing a magnetic flux, comprising:
   a pinning layer;
   a first ferromagnetic layer of a first Heusler alloy extending in a first plane adjacent the pinning layer;
   a second ferromagnetic layer of a second Heusler alloy extending in a second plane generally parallel with the first plane; and
   a non-ferromagnetic spacer layer between the first ferromagnetic layer and the second ferromagnetic layer of a non-ferromagnetic Heusler-like alloy comprising an alloy having a crystal structure of a Heusler alloy without the presence of MN and having an energy band sufficiently similar to energy bands of the first Heusler alloy and the second Heusler alloy to provide asymmetry in majority and minority spin states and selective scatter of electrons at interfaces between the ferromagnetic layers and the non-ferromagnetic spacer layer and thereby allow a giant magnetoresistive effect to occur in the presence of a magnetic field.

2. The apparatus of claim 1 wherein the spacer layer comprises a material having a crystal structure which is the same as a Heusler alloy crystal structure.

3. The apparatus of claim 1 wherein the energy bands are similar near the Fermi energy level.

4. The apparatus of claim 1 wherein the first Heusler alloy comprises $Co_2MnSi$.

5. The apparatus of claim 1 wherein the first Heusler alloy comprises $Co_2MnGe$.

6. The apparatus of claim 1 wherein the non-ferromagnetic Heusler-like alloy comprises $Rh_2CuSn$.

7. The apparatus of claim 1 wherein the non-ferromagnetic Heusler-like alloy comprises $Co_2CuSn$.

8. The apparatus of claim 1 wherein the first and second Heusler alloys are the same Heusler alloy.

9. A magnetic storage system including the giant magnetoresistive spin valve sensor of claim 1.

10. A method for making a giant magnetoresistive spin valve sensor for sensing magnetic flux, comprising:
    providing a pinning layer;
    providing a first ferromagnetic layer of a first Heusler alloy extending in a first plane adjacent the pinning layer;
    providing a second ferromagnetic layer of a second Heusler alloy extending in a second plane generally parallel with the first plane;
    providing a non-ferromagnetic spacer layer between the first ferromagnetic layer and the second ferromagnetic layer of a non-ferromagnetic Heusler-like alloy comprising an alloy having a crystal structure of a Heusler alloy without the presence of MN; and
    wherein the energy band of the non-ferromagnetic Heusler-like alloy is sufficiently similar to the energy bands of the first Heusler alloy and the second Heusler alloy to provide asymmetry in majority and minority spin states and selective scatter of electrons at interfaces between the ferromagnetic layers and the non-ferromagnetic spacer layer and thereby allow a giant magnetoresistive effect to occur in the presence of a magnetic field.

11. The method of claim 10 including matching the energy bands near the Fermi energy level.

12. The method of claim 10 including matching the crystal structure of the non-ferromagnetic Heusler-like alloy with the crystal structures of the first and second Heusler alloys.

13. The method of claim 10 wherein the first Heusler alloy comprises $Co_2MnSi$.

14. The method of claim 10 wherein the first Heusler alloy comprises $Co_2MnGe$.

15. The method of claim 10 wherein the non-ferromagnetic Heusler-like alloy comprises $Rh_2CuSn$.

16. The method of claim 10 wherein the non-ferromagnetic Heusler-like alloy comprises $Co_2CuSn$.

17. A giant magnetoresistive sensor made in accordance with the method of claim 10.

18. A giant magnetoresistive spin valve sensor for sensing a magnetic flux, comprising:
    a first Heusler alloy ferromagnetic layer means for responding to an applied magnetic field;
    a pinning means for pinning a magnetic vector of the first ferromagnetic Heusler alloy means;

a second ferromagnetic Heusler alloy means having a magnetic vector for responding to the magnetic field; and a non-ferromagnetic Heusler-like alloy spacer layer means comprising an alloy having a crystal structure of a Heusler alloy without the presence of MN for providing asymmetry in majority and minority spin states and selective scatter of electrons and thereby promoting a giant magnetoresistive effect in the first and second ferromagnetic Heusler alloy layer means by providing an energy band similar to energy bands of the first and second ferromagnetic Heusler alloy layer means.

* * * * *